(12) United States Patent
Lu et al.

(10) Patent No.: US 11,906,577 B2
(45) Date of Patent: Feb. 20, 2024

(54) PAD STRUCTURE AND TESTKEY STRUCTURE AND TESTING METHOD FOR SEMICONDUCTOR DEVICE

(71) Applicant: WUHAN XINXIN SEMICONDUCTOR MANUFACTURING CO., LTD., Hubei (CN)

(72) Inventors: Linzhi Lu, Hubei (CN); Le Li, Hubei (CN); Jiwei He, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 232 days.

(21) Appl. No.: 17/555,963

(22) Filed: Dec. 20, 2021

(65) Prior Publication Data
US 2022/0404416 A1    Dec. 22, 2022

(30) Foreign Application Priority Data
Jun. 21, 2021   (CN) .......................... 202110686466.1

(51) Int. Cl.
  *G01R 31/28*   (2006.01)
  *H01L 21/66*   (2006.01)
  *H01L 23/00*   (2006.01)

(52) U.S. Cl.
  CPC ..... *G01R 31/2887* (2013.01); *G01R 31/2889* (2013.01); *H01L 22/14* (2013.01)

(58) Field of Classification Search
  CPC .......................... G01R 31/28; G01R 31/2887; G01R 31/2889; H01L 21/66; H01L 22/14; H01L 23/00; H01L 23/053; H01L 23/12; H01L 23/44; H01L 23/48; H01L 23/52; H01L 23/98
  See application file for complete search history.

(56) References Cited

U.S. PATENT DOCUMENTS

| | | | |
|---|---|---|---|
| 6,313,537 B1 * | 11/2001 | Lee | H01L 24/03 257/784 |
| 2020/0027784 A1 * | 1/2020 | Park | H01L 23/481 |
| 2020/0243416 A1 | 7/2020 | Chen | |

FOREIGN PATENT DOCUMENTS

CN             112018027 A      12/2020

* cited by examiner

*Primary Examiner* — Neel D Shah
(74) *Attorney, Agent, or Firm* — Muncy, Geissler, Olds & Lowe, P.C.

(57) ABSTRACT

The present disclosure provides a pad structure and a testkey structure and a testing method for a semiconductor device. The pad structure includes: an insulating dielectric layer formed on a substrate; a metal interconnection structure formed in the insulating dielectric layer, the metal interconnection structure comprising a first section and a second section, which are insulated from each other; and a pad formed on the top of the insulating dielectric layer so as to be exposed therefrom at least at its top surface, electrically connected to the first section, and insulated from the second section. With this disclosure, reduced capture of plasma is achievable, mitigating adverse impact of plasma on the semiconductor device.

20 Claims, 5 Drawing Sheets

PAD STRUCTURE AND TESTKEY STRUCTURE AND TESTING METHOD FOR SEMICONDUCTOR DEVICE

CROSS-REFERENCE TO RELATED APPLICATION

This application claims the priority of Chinese patent application number 202110686466.1, filed on Jun. 21, 2021, the entire contents of which are incorporated herein by reference.

TECHNICAL FIELD

The present disclosure relates to manufacturing of semiconductor integrated circuits and, more specifically, to a pad structure and a testkey structure and a testing method for a semiconductor device.

BACKGROUND

In the technical filed of the manufacturing of integrated circuits, testkey structures may be designed for testing for device or process monitoring. Referring to FIGS. 1a and 1b, a testkey structure includes at least two pad structures formed in an insulating dielectric layer 12 which is disposed over a substrate 11 and a test pattern 10 electrically connected to the pad structures. Each pad structure includes a plurality of metal layers 13, conductive plugs 14 and a pad 15, which are electrically connected. Adjacent metal layers 13 are electrically connected by the conductive plugs 14, and a top surface of the pad 15 is exposed from the insulating dielectric layer 12 so as to be able to be brought into contact with probe needles. One or more of the metal layers 13 are electrically connected to the test pattern 10 so that testing voltages or currents can be applied to the test pattern 10 when the probe needles are in contact with the pad 15.

In order to facilitate the contact between the probe needles and the pad 15 during testing, the pad 15, and hence each of the metal layers 13 electrically connected thereto, are typically designed with a rather large cross-sectional area. However, in some manufacturing processes (e.g., etching) of integrated circuits, a lot of plasma may be produced, which tends to be captured by metal chunks like the pad 15 and the metal layers 13. If the plasma cannot be removed in time (e.g., when the substrate 11 is an SOI substrate further with an intermediate buried insulating layer separating a lower substrate from an upper semiconductor layer, plasma captured by the pad structures cannot be removed via the lower substrate), it may potentially travel into a semiconductor device, leading to impaired performance of the semiconductor device and possibly making normal semiconductor device and process monitoring impossible.

Therefore, there is an urgent need to mitigate the adverse impact of plasma captured by a pad structure on a semiconductor device.

SUMMARY OF THE DISCLOSURE

It is an object of the present disclosure to provide a pad structure and a testkey structure and a testing method for a semiconductor device, which allows a smaller amount of captured plasma, which has reduced adverse impact on the semiconductor device.

To this end, the present disclosure provides a pad structure, comprising:
an insulating dielectric layer formed on a substrate;
a metal interconnection structure formed in the insulating dielectric layer, the metal interconnection structure comprising a first section and a second section, which are insulated from each other; and
a pad that is formed on a top of the insulating dielectric layer so that at least a top surface of the pad is exposed from the insulating dielectric layer, wherein the pad is electrically connected to the first section, and insulated from the second section.

Optionally, each of the first section and the second section comprises a plurality of metal layers and a plurality of conductive plugs, the metal layers formed in the insulating dielectric layer vertically one above another so that adjacent ones of metal layers are electrically connected to each other by the conductive plugs.

Optionally, the first section surrounds the second section.

Optionally, the second section surrounds the first section.

Optionally, the first section is an annular or elongate structure.

Optionally, the metal layers in the first section have a cross-sectional area that is smaller than a cross-sectional area of the metal layers in the second section.

Optionally, the substrate comprises a lower substrate, an intermediate buried insulating layer disposed over the lower substrate, and an upper semiconductor layer disposed over the intermediate buried insulating layer.

Optionally, an STI structure is formed in the semiconductor layer.

Optionally, the STI structure has a bottom side in contact with the buried insulating layer, wherein a vertical projection of the first section in the semiconductor layer overlaps at least part of the STI structure, and wherein the pad structure further comprises a hole plug having one end electrically connected to the first section, and a further end extends from the insulating dielectric layer through the STI structure and the buried insulating layer so as to come into contact with the lower substrate.

Optionally, a distance is formed between the first section and the second section.

Optionally, a constant distance is formed between the first section and the second section.

Optionally, the metal interconnection structure is insulated from the substrate. Optionally, each of the first section and the second section comprises four metal layers and a plurality of conductive plugs, the metal layers formed in the insulating dielectric layer vertically one above another so that adjacent ones of metal layers are electrically connected to each other by the conductive plugs.

Optionally, the one end of the hole plug is electrically connected to a bottom of the first section.

The present disclosure also provides a testkey structure for a semiconductor device, the testkey structure comprising:
a substrate;
at least two pad structures as defined above formed on the substrate; and
a test pattern formed in an insulating dielectric layer of the substrate, wherein the first sections of the pad structures are electrically connected to, and the second sections of the pad structures are insulated from, the test pattern.

The present disclosure also provides a testing method for a semiconductor device, the testing method comprising:
providing a testkey structure as defined above; and
bringing probe needles on a tester into contact with the top surfaces of the pads that are exposed from the insulating dielectric layers in the testkey structure and applying voltages or currents to the test pattern.

The present disclosure provides the following advantages over the prior art:

1. The design of the metal interconnection structure in the pad structure where the first and second sections are insulated from each other and the pad is electrically connected to the first section but is insulated from the second section allows a reduced metal area of the pad structure susceptible to the capture of plasma, resulting in less captured plasma and thus mitigating adverse impact of plasma on the semiconductor device.
2. For the testkey structure and testing method, because of less plasma that can be captured by the pad structures in the testkey structure, adverse impact of plasma on the semiconductor device is mitigated, resulting in higher accuracy of semiconductor device or process monitoring using the testkey structure.

Figure 1A:
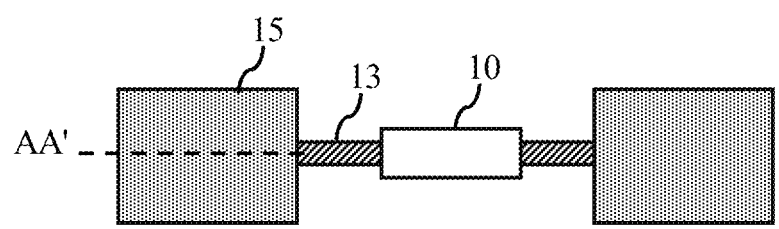
FIG. 1a shows a schematic top view of a testkey structure for a semiconductor device.
Figure 1B:
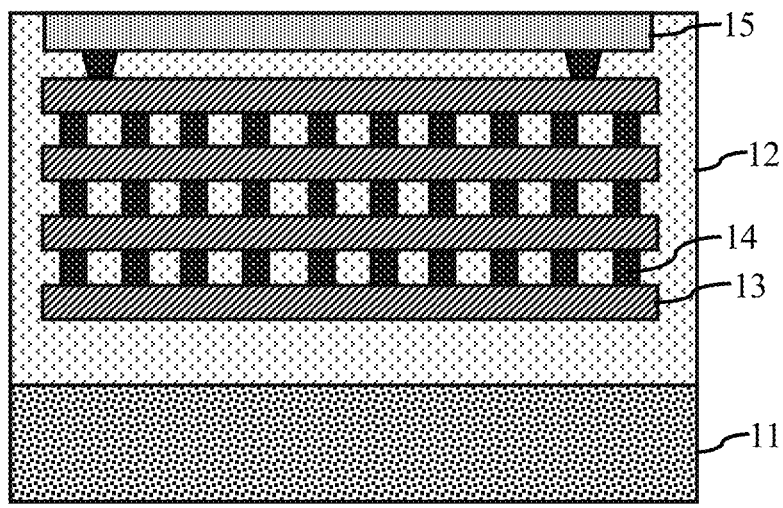
FIG. 1b shows a schematic cross-sectional view of a conventional pad structure in the testkey structure of FIG. 1a taken along AA' direction.

LIST OF REFERENCE NUMERALS 10 denotes a test pattern; 11, a substrate; 12, an insulating dielectric layer; 13, a metal layer; 14, a conductive plug; 15, a pad; 21, a substrate; 211, a lower substrate; 212, a buried insulating layer; 213, a semiconductor layer; 22, an insulating dielectric layer; 23, a metal layer; 24, a conductive plug; 25, a pad; 26, an STI structure; and 27, a hole plug.

DETAILED DESCRIPTION

Objects, advantages and features of the present disclosure will become more apparent from the following detailed description of pad structures, testkey structures and testing methods for a semiconductor device proposed herein, which is to be read in connection with the accompanying drawings. Note that the figures are provided in a very simplified form not necessarily drawn to exact scale for the only purpose of helping to explain the embodiments disclosed herein in a more convenient and clearer way.

In one embodiment of the present disclosure, there is provided a pad structure including an insulating dielectric layer, a metal interconnection structure and a pad. The insulating dielectric layer is formed on a substrate, and the metal interconnection structure, which is formed in the insulating dielectric layer, includes a first section and a second section insulated from the first section. The pad is formed on the top of the insulating dielectric layer so as to be exposed from the insulating dielectric layer at least at a top surface thereof and is electrically connected to the first section but electrically insulated with the second section. The metal interconnection structure is insulated from the substrate.

Figure 2A:
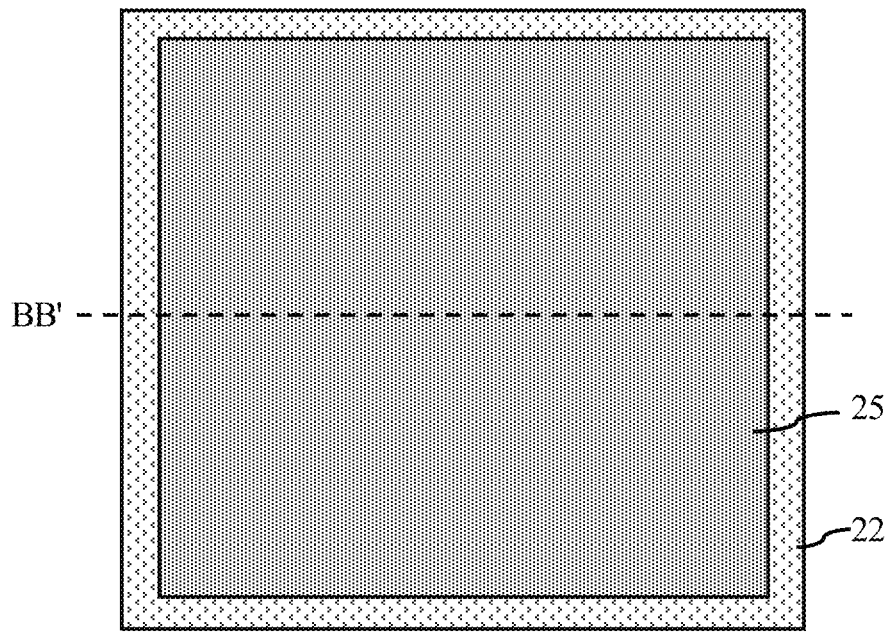
FIGS. 2a to 2b are schematic top views of a pad structure according to an embodiments of the present disclosure.
Figure 2B:
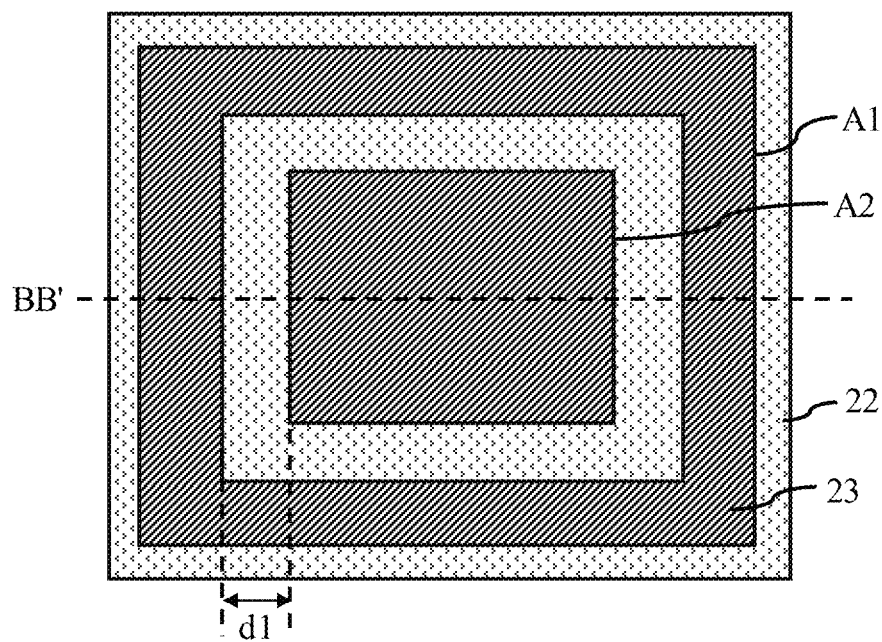

The pad structure according to this embodiment will be described in greater detail below with reference to FIGS. 2a to 2b and FIGS. 3a to 3d. FIG. 2a is a schematic top view of the pad in the pad structure. FIG. 2b is a schematic top view of a metal layer in the pad structure. FIGS. 3a to 3d are schematic longitudinal cross-sectional views of four embodiments of the pad structure.

Figure 3A:
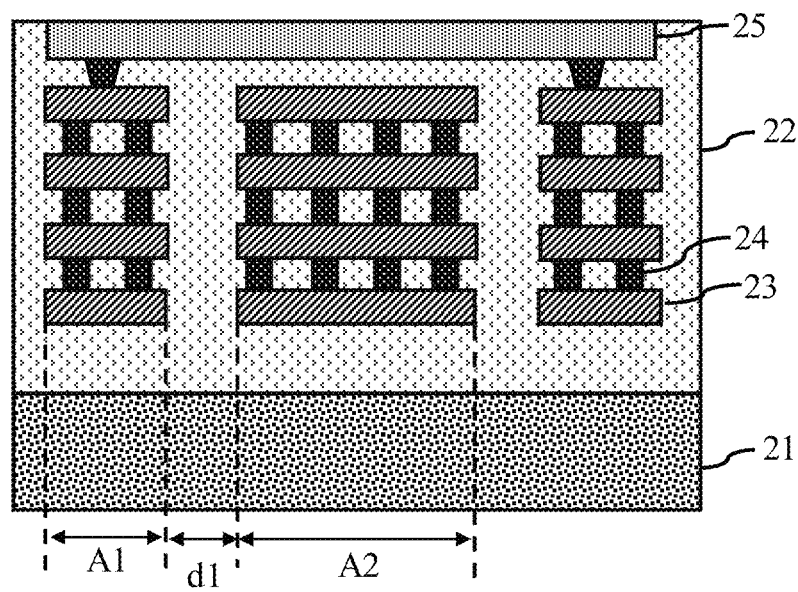
FIGS. 3a to 3d are schematic cross-sectional views of the pad structure of FIGS. 2a to 2b taken along BB' direction.
Figure 3B:
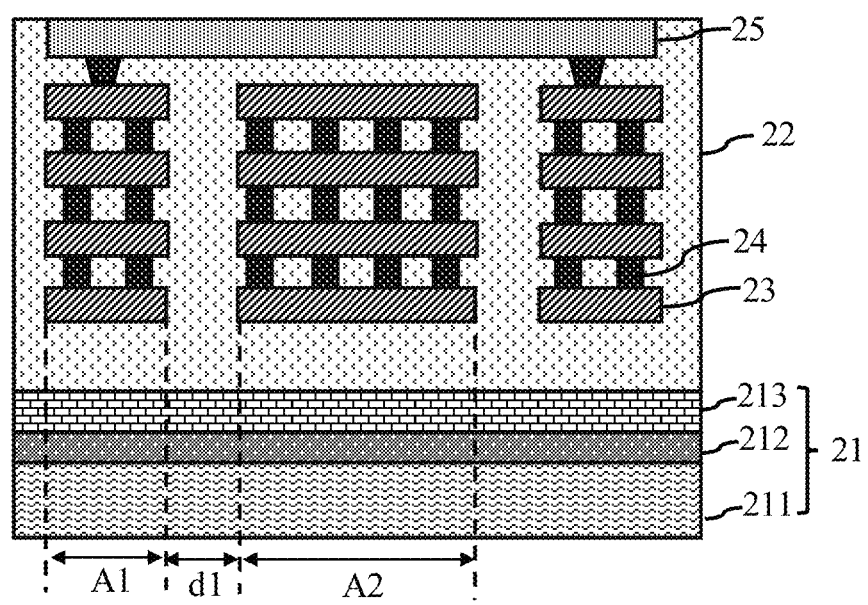
Figure 3C:
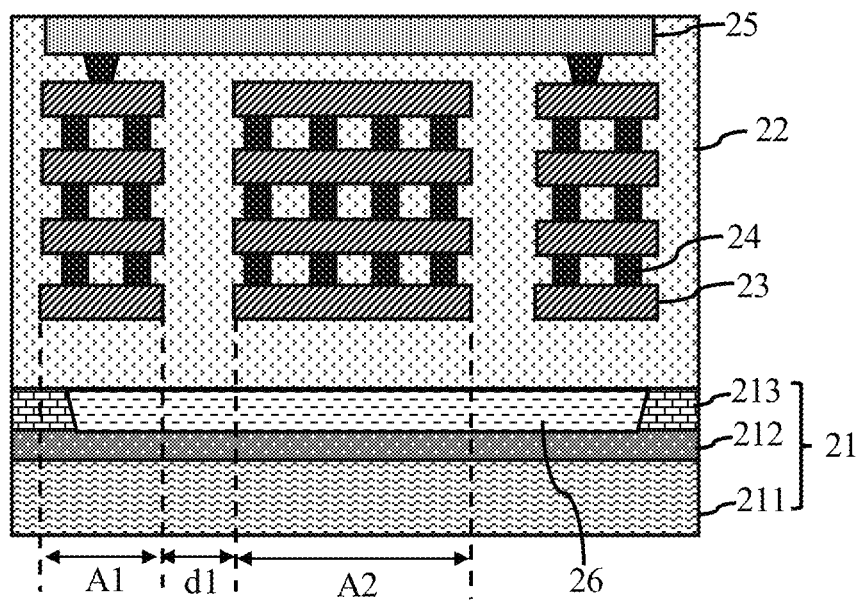
Figure 3D:
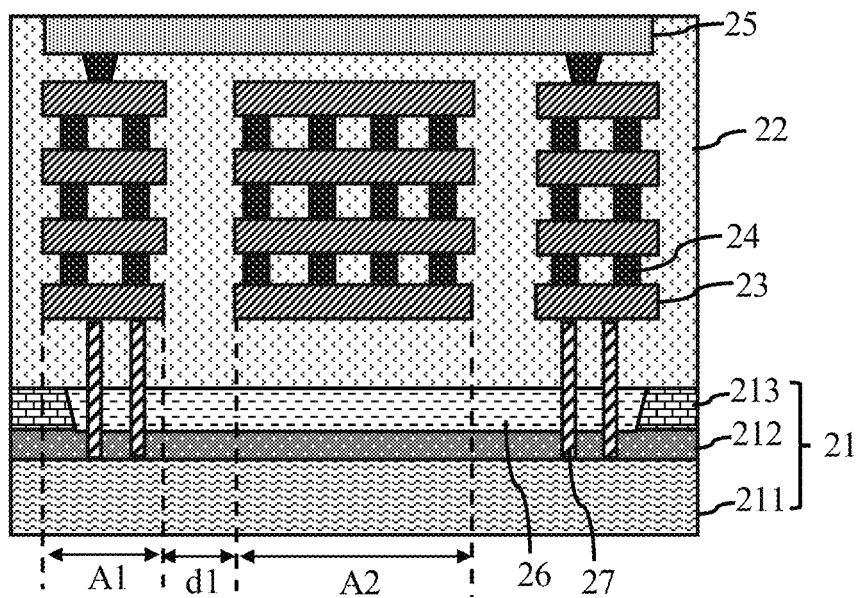

The pad structure is applicable to both semiconductor-on-insulator (SOI) and non-SOI substrates. The first embodiment shown in FIG. 3a is suitable for non-SOI substrates, and the second to fourth embodiments shown in FIG. 3b-3d are suitable for SOI substrates. In the case of an SOI substrate, the substrate 21 may include a lower substrate 211, an intermediate buried insulating layer 212 disposed over the lower substrate 211, and an upper semiconductor layer 213 disposed over the intermediate buried insulating layer 212.

The insulating dielectric layer 22 may be deposited on the substrate 21, and may consist of multiple insulating material layers (not shown). A semiconductor device or part thereof (e.g., a gate structure thereof) may be formed in the insulating material layer that is closest to the substrate 21, while the metal interconnection structure may be formed in the insulating material layer(s) that is farther away from the substrate 21.

The metal interconnection structure includes a first section A1 and a second section A2, which are electrically insulated from each other.

Each of the first section A1 and the second section A2 includes multiple metal layers 23 and multiple conductive plugs 24. The metal layers 23 are formed in the insulating dielectric layer 22 vertically one above another, and adjacent ones of them are electrically connected to each other by the conductive plugs 24. The embodiments shown in FIGS. 3a to 3d are those with four metal layers 23.

The metal layers 23 in the first section A1 are insulated from those in the second section A2. As shown in FIGS. 2b and 3a to 3d, each metal layer 23 in the first section A1 may be located at the same plane as a respective one of the layers in the second section A2 and spaced apart therefrom by a distance, especially a constant distance of d1. The larger the distance d1 is, the smaller the cross-sectional area of the layers is in the first section A1 and/or the second section A2, and also the smaller the number of conductive plugs 24 is therein.

The first section A1 may be brought into electrical connection with an underlying semiconductor device via the conductive plugs 24, with the second section A2 being electrically insulated from the semiconductor device.

As shown in FIGS. 2b and 3a to 3d, the first section A1 may surround the second section A2. In FIG. 2b, only the annular metal layers 23 in the first section A1 and second section A2 are shown, while the conductive plugs 24 are not.

The first section A1 may be a closed annulus, which is integral and continuous in each or at least some of the metal layers 23. In this case, the metal layers 23 and the conductive plugs 24 in the first section A1 may form a three-dimensional annular structure surrounding the second section A2.

Alternatively, the first section A1 may be a linear or curved elongate structure that is not closed.

Figure 4:
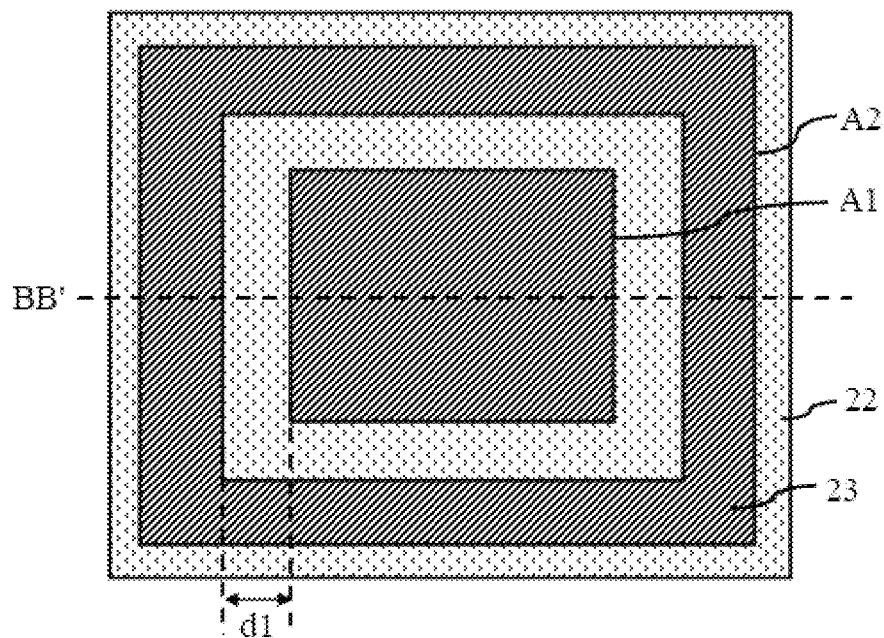
FIG. 4 shows a top view of a pad structure according to another embodiment of the present disclosure.
Figure 5:
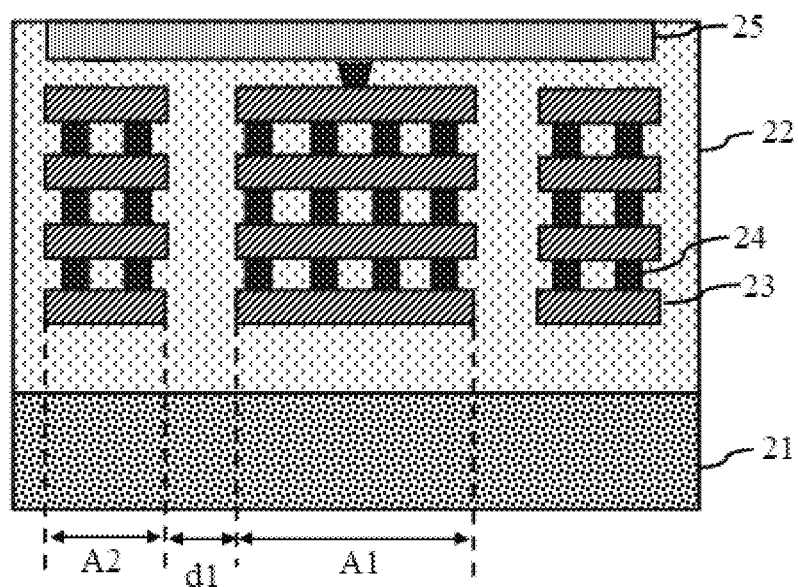
FIG. 5 shows a schematic cross-sectional view of the pad structure of FIG. 4 taken along BB' direction.

Likewise, the second section A2 may also be an annular structure surrounding the first section A1, as shown in FIGS. 4-5. Optionally, the second section A2 may also be an elongate structure. The shapes of the first section A1 and the second section A2 may be either similar or not.

It is to be noted that the shapes of the first section A1 and the second section A2 and the positional relationship of them are not limited to those shown and discussed above as any other shapes and positional relationship achievable by the process used are possible. For example, the second section A2 may include at least two separate portions, and when these portions and the first section A1 are all elongate, the first section A1 may be located between two portions of the second section A2, or completely beside the second section A2. Moreover, if the portions of the second section A2 and the first section A1 are all annular, then one portion of the second section A2 may surround the first section A1, and another portion of the second section A2 may be surrounded by the first section A1.

Compared with the conventional monolithic metal interconnection structure, the design with the first section A1 being electrically connected to the pad 25 and the second section A2 being separate and insulated from the first section A1 and insulated from the pad 25 allows a reduced area of the metal interconnection structure in electrical connection with the pad 25, resulting in a reduced quantity of plasma that the pad can capture and less adverse impact thereof on the semiconductor device. Therefore, the present disclosure is not limited to any particular shape or positional relationship of the first section A1 and the second section A2, and FIGS. 2a-2b and FIGS. 3a-3d only show some embodiments.

The pad 25 is formed on the top of the insulating dielectric layer 22 so that at least a top surface of the pad 25 is exposed from the insulating dielectric layer 22. Therefore, the top surface of the pad 25 may be higher or lower than or flush with a top surface of the insulating dielectric layer 22.

As shown in FIG. 2a, the pad 25 may be a rectangular structure with a relatively large area. The pad 25 is aligned with (see FIGS. 3a to 3d) or partially or entirely staggered from the metal interconnection structure in the direction perpendicular to a top surface of the substrate 21.

The pad 25 is electrically connected to the first section A1, more specifically to the metal layers 23 via the conductive plugs 24 therein but is electrically insulated from the second section A2.

Since the second section A2 of the metal interconnection structure is electrically insulated from both the semiconductor device in the closest insulating material layer to the substrate 21 and the pad 25, it will not capture plasma even in a process that produces a lot of plasma (e.g., etching), it only functions as a mechanical support. In the metal interconnection structure, as only the first section A1 can capture plasma, a reduced metal area of the metal interconnection structure susceptible to the capture of plasma is achieved, resulting in a reduced quantity of captured plasma that is detrimental both to the operational performance of the semiconductor device and to normal semiconductor device and process monitoring.

Preferably, the metal layers 23 in the first section A1 have a cross-sectional area that is smaller than a cross-sectional area of the metal layers 23 in the second section A2. This can result in an additionally reduced metal area susceptible to the capture of plasma and thus a further reduced quantity of captured plasma.

Further, in the case of the substrate 21 being an SOI substrate, referring to FIGS. 3c and 3d, in the semiconductor layer 213, there may be formed a shallow trench isolation (STI) structure 26 having a bottom side contacting the buried insulating layer 212 (i.e., the STI structure 26 may extend through at least the semiconductor layer 213). A top side of the STI structure 26 may be slightly lower or higher than or flush with a top side of the semiconductor layer 213.

With continued reference to FIG. 3d, a vertical projection of the first section A1 on the semiconductor layer 213 may overlap at least part of the STI structure 26. The pad structure may further include a hole plugs 27, one end of which is electrically connected to the first section A1, especially to a bottom of the first section A1, and the other end extends from the insulating dielectric layer 22 through the STI structure 26 and the buried insulating layer 212 so as to come into contact with the lower substrate 211. This design allow plasma captured by the pad 25 and the first section A1 to be removed via the hole plug 27 and the lower substrate 211, resulting in an even further reduced quantity of captured plasma that is detrimental both to the operational performance of the semiconductor device and to normal semiconductor device and process monitoring.

The other end of the hole plug 27 may terminate exactly at and come into contact with the top surface of the lower substrate 211. Alternatively, it may extend into the lower substrate 211.

As can be seen from the above disclosure, the design of the metal interconnection structure in the pad structure where the first and second sections are insulated from each other and the pad is electrically connected to the first section but is insulated from the second section allows a reduced metal area of the pad structure susceptible to the capture of plasma, resulting in less captured plasma and thus mitigating adverse impact of plasma on the semiconductor device.

In embodiments of the present disclosure, there is also provided a testkey structure for a semiconductor device, comprising a substrate, at least two pad structures and a test pattern.

The pad structures are formed on the substrate. Reference can be made to the above description for details in the structure of the pad structures, and a further description thereof is deemed unnecessary and therefore omitted in the interest of brevity.

The test pattern is formed in the insulating dielectric layer on the substrate, and the first sections of the at least two pad structures are electrically connected to the test pattern, while the second sections of the at least two pad structures are insulated from the test pattern.

In the metal interconnection structure of each pad structure, the first and second sections are insulated from each other, and the pad is electrically connected to the first section but is insulated from the second section. This design allows a reduced metal area of the pad structure susceptible to the capture of plasma, resulting in less captured plasma and thus mitigating adverse impact of plasma on the semiconductor device. As a result, more accurate semiconductor device or process monitoring can be achieved using the testkey structure.

In embodiments of the present disclosure, there is also provided a testing method for a semiconductor device.

The method includes providing the above-discussed testkey structure. Reference can be made to the above description for details in the structure of the testkey structure, and a further description thereof is deemed unnecessary and therefore omitted in the interest of brevity.

The method also includes bringing probe needles on a tester into contact with the top surfaces of the pads that are exposed from the insulating dielectric layers in the testkey structure and applying testing voltages or currents to the test pattern through the pads and first sections in the at least two pad structures.

Because of less plasma that can be captured by the pad structures in the testkey structure, adverse impact of plasma on the semiconductor device is mitigated, resulting in higher accuracy of semiconductor device or process monitoring using the testkey structure.

The foregoing description presents merely preferred embodiments of the present disclosure and is not intended to limit the scope of the present disclosure in any sense. It is intended that all changes and modifications made by those of ordinary skill in the art in light of the above teachings fall within the scope of the appended claims.

What is claimed is:

1. A pad structure, comprising:
   an insulating dielectric layer formed on a substrate;
   a metal interconnection structure formed in the insulating dielectric layer, the metal interconnection structure comprising a first section and a second section, which are insulated from each other; and
   a pad that is formed on a top of the insulating dielectric layer so that at least a top surface of the pad is exposed from the insulating dielectric layer, wherein the pad is electrically connected to the first section, and insulated from the second section.

2. The pad structure of claim 1, wherein each of the first section and the second section comprises a plurality of metal layers and a plurality of conductive plugs, the metal layers formed in the insulating dielectric layer vertically one above another so that adjacent ones of metal layers are electrically connected to each other by the conductive plugs.

3. The pad structure of claim 1, wherein the first section surrounds the second section.

4. The pad structure of claim 1, wherein the second section surrounds the first section.

5. The pad structure of claim 1, wherein the first section is an annular or elongate structure.

6. The pad structure of claim 2, wherein the metal layers in the first section have a cross-sectional area that is smaller than a cross-sectional area of the metal layers in the second section.

7. The pad structure of claim 1, wherein the substrate comprises a lower substrate, an intermediate buried insulating layer disposed over the lower substrate, and an upper semiconductor layer disposed over the intermediate buried insulating layer.

8. The pad structure of claim 7, wherein an STI structure is formed in the semiconductor layer.

9. The pad structure of claim 8, wherein the STI structure has a bottom side in contact with the buried insulating layer, wherein a vertical projection of the first section in the semiconductor layer overlaps at least part of the STI structure.

10. The pad structure of claim 8, wherein the pad structure further comprises a hole plug having one end electrically connected to the first section, and a further end extends from the insulating dielectric layer through the STI structure and the buried insulating layer so as to come into contact with the lower substrate.

11. The pad structure of claim 10, wherein the one end of the hole plug is electrically connected to a bottom of the first section.

12. The pad structure of claim 1, wherein a distance is formed between the first section and the second section.

13. The pad structure of claim 1, wherein a constant distance is formed between the first section and the second section.

14. The pad structure of claim 1, wherein the metal interconnection structure is insulated from the substrate.

15. The pad structure of claim 1, wherein each of the first section and the second section comprises four metal layers and a plurality of conductive plugs, the metal layers formed in the insulating dielectric layer vertically one above another so that adjacent ones of metal layers are electrically connected to each other by the conductive plugs.

16. A testkey structure for a semiconductor device, the testkey structure comprising:
   a substrate;
   at least two pad structures formed on the substrate, each of the pad structure comprising:
   an insulating dielectric layer formed on the substrate;
   a metal interconnection structure formed in the insulating dielectric layer, the metal interconnection structure comprising a first section and a second section, which are insulated from each other; and
   a pad that is formed on a top of the insulating dielectric layer so that at least a top surface of the pad is exposed from the insulating dielectric layer, wherein the pad is electrically connected to the first section, and insulated from the second section; and
   a test pattern formed in an insulating dielectric layer of the substrate, wherein the first sections of the pad structures are electrically connected to, and the second sections of the pad structures are insulated from, the test pattern.

17. The testkey structure of claim 16, wherein each of the first section and the second section comprises a plurality of metal layers and a plurality of conductive plugs, the metal layers formed in the insulating dielectric layer vertically one above another so that adjacent ones of metal layers are electrically connected to each other by the conductive plugs.

18. The testkey structure of claim 16, wherein the first section surrounds the second section.

19. The testkey structure of claim 17, wherein the metal layers in the first section have a cross-sectional area that is smaller than a cross-sectional area of the metal layers in the second section.

20. A testing method for a semiconductor device, the testing method comprising:
   providing a testkey structure as defined in claim 16; and
   bringing probe needles on a tester into contact with the top surfaces of the pads that are exposed from the insulating dielectric layers in the testkey structure and applying voltages or currents to the test pattern.

* * * * *